(12) United States Patent
Long et al.

(10) Patent No.: US 9,478,562 B2
(45) Date of Patent: Oct. 25, 2016

(54) ARRAY SUBSTRATE AND MANUFACTURING METHOD THEREOF, DISPLAY DEVICE, THIN FILM TRANSISTOR AND MANUFACTURING METHOD THEREOF

(71) Applicant: BOE TECHNOLOGY GROUP CO., LTD., Beijing (CN)

(72) Inventors: Chunping Long, Beijing (CN); Zheng Liu, Beijing (CN); Zuqiang Wang, Beijing (CN); Jang Soon Im, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/646,416

(22) PCT Filed: Sep. 23, 2014

(86) PCT No.: PCT/CN2014/087139
§ 371 (c)(1),
(2) Date: May 21, 2015

(87) PCT Pub. No.: WO2015/180320
PCT Pub. Date: Dec. 3, 2015

(65) Prior Publication Data
US 2016/0181289 A1 Jun. 23, 2016

(30) Foreign Application Priority Data
May 27, 2014 (CN) .......................... 2014 1 0226377

(51) Int. Cl.
*H01L 21/00* (2006.01)
*H01L 27/12* (2006.01)
(Continued)

(52) U.S. Cl.
CPC ......... *H01L 27/1222* (2013.01); *H01L 27/124* (2013.01); *H01L 27/1214* (2013.01);
(Continued)

(58) Field of Classification Search
CPC ............. H01L 27/1214; H01L 27/124; H01L 27/1248; H01L 27/127; H01L 27/3244; H01L 27/3248

USPC ........ 257/59, 66, 72, 99; 438/149, 164, 597, 438/598, 619
See application file for complete search history.

(56) References Cited

U.S. PATENT DOCUMENTS 8,760,596 B2   6/2014   Choi et al.
2005/0082530 A1*   4/2005   Koo .................. H01L 29/78615
257/66

(Continued)

FOREIGN PATENT DOCUMENTS

CN          102683338 A        9/2012
CN          202601619 U       12/2012

(Continued)

OTHER PUBLICATIONS

International Search Report of the International Search Authority of PCT/CN2014/087139 in Chinese, mailed on Feb. 26, 2015.

(Continued)

*Primary Examiner* — Matthew E Warren
(74) *Attorney, Agent, or Firm* — Collard & Roe, P.C.

(57) ABSTRACT

An array substrate and manufacturing method thereof, a display device, a thin film transistor and manufacturing method thereof are provided. The manufacturing method of an array substrate includes forming an active material layer (501), a gate insulating layer (204) and a metal thin film (502) on a base substrate (201), and forming a pattern including an active layer (203) and a pattern including a gate electrode (205), a source electrode (206), a drain electrode (207), a gate line (1063) and a data line (1061) by a first patterning process; forming a passivation layer (301) on the base substrate (201), and forming a source contact hole (302), a drain contact hole (303), and an bridge-structure contact hole (1062*a*) by a second patterning process; forming a transparent conductive thin film (1401) on the base substrate (201), and removing the transparent conductive thin film (1404) partially, so that a source contact section (401), a drain contact section (402), a pixel electrode (403), and an bridge structure (1062) are formed. With the manufacturing method, the use number of patterning processes is decreased.

19 Claims, 6 Drawing Sheets

(51) Int. Cl.
*H01L 29/66* (2006.01)
*H01L 29/786* (2006.01)
*H01L 27/32* (2006.01)

(52) U.S. Cl.
CPC ....... *H01L 27/1218* (2013.01); *H01L 27/1248* (2013.01); *H01L 27/1255* (2013.01); *H01L 27/1274* (2013.01); *H01L 27/1288* (2013.01); *H01L 27/3246* (2013.01); *H01L 27/3248* (2013.01); *H01L 29/66757* (2013.01); *H01L 29/78675* (2013.01); *H01L 2227/323* (2013.01)

(56) References Cited

U.S. PATENT DOCUMENTS

2005/0285197 A1* 12/2005 Park .................... H01L 29/4908
257/347
2011/0299005 A1 12/2011 Takeguchi et al.
2012/0120362 A1 5/2012 Choi et al.
2014/0117370 A1* 5/2014 Ma ........................ H01L 27/124
257/72
2014/0117371 A1 5/2014 Ma

FOREIGN PATENT DOCUMENTS

| | | |
|---|---|---|
| CN | 103123910 A | 5/2013 |
| CN | 104022076 A | 9/2014 |
| CN | 104022077 A | 9/2014 |

OTHER PUBLICATIONS

Written Opinion of the International Search Authority of PCT/CN2014/087139 in Chinese, mailed on Feb. 26, 2015 with an English translation.

* cited by examiner

ARRAY SUBSTRATE AND MANUFACTURING METHOD THEREOF, DISPLAY DEVICE, THIN FILM TRANSISTOR AND MANUFACTURING METHOD THEREOF

CROSS REFERENCE TO RELATED APPLICATIONS

This application is the National Stage of PCT/CN2014/087139 filed on Sep. 23, 2014, which claims priority under 35 U.S.C. §119 of Chinese Application No. 201410226377.9 filed on May 27, 2014, the disclosure of which is incorporated by reference.

TECHNICAL FIELD

At least one embodiment of the present invention relates to an array substrate and manufacturing method thereof, a display device, a thin film transistor and manufacturing method thereof.

BACKGROUND

An Active Matrix mode display device is a kind of display devices in which display driving of pixels is executed by using Thin Film Transistors (briefly called as TFTs), has the merits of lightness and thinness, lower power consumption, low radiation, low coat and so on, and is the current mainstream display technology.

Active Matrix mode display devices each include a TFT array substrate, and based on the variances in the forming material of a TFT active layer, TFT array substrates can be classified into multiple types, such as, amorphous silicon (a-Si:H), Low Temperature Poly-Silicon (briefly called as LTPS), High Temperature Poly-Silicon (briefly called as HTPS), oxide semiconductor array substrate and so on. A LTPS TFT array substrate has become one of the current research hotspots in the field by virtue of its merits of high carrier mobility, high level of integration capability, strong anti-interference ability, etc.

Figure 1:
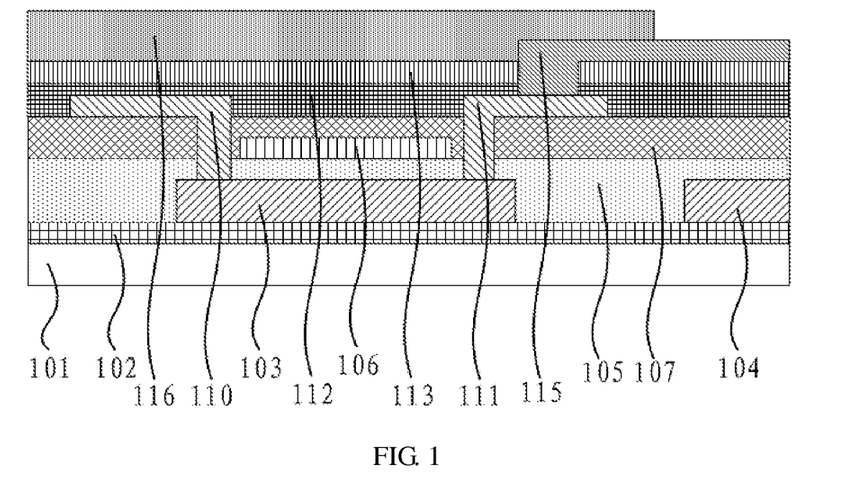
FIG. 1 is a structurally schematic view illustrating a TFT array substrate.

A LTPS TFT array substrate usually includes a plurality of gate lines in a first direction and a plurality of data lines in a second direction, and the first direction and the second direction are perpendicular to each other, so that a plurality of pixel units arranged in the form of a matrix are defined and formed. As illustrated in FIG. 1, each of the pixel units includes a pixel electrode 115; a storage electrode 104 lying in a lower level than the pixel electrode 115; and a TFT situated at the intersection of a gate line (not illustrated in the figure) and a data line (not illustrated in the figure), which is connected to the pixel electrode 115, and useful for driving the pixel electrode. The TFT includes an active layer 103, a gate electrode 106, a source electrode 110 and a drain electrode 111. In general, the gate electrode 106 is connected to the gate line, the source electrode 106 is connected to the data line, and the drain electrode 111 is connected to the pixel electrode 115.

A method for manufacturing a LTPS TFT array substrate usually includes that, a buffer layer 102, a pattern including an active layer 103 and a storage electrode 104, a gate insulating layer 105, a pattern including a gate electrode 106 and a gate line, an interlayer insulating layer 107, a source contact hole, a drain contact hole, a pattern including a source electrode 110, a drain electrode 111 and a data line, a passivation layer 112, a pixel-electrode contact hole within the passivation layer, a planarizing layer 113, a pixel-electrode contact hole within the planarizing layer 113 (which intercommunicates with the pixel-electrode contact hole within the passivation layer 112), a pixel electrode 115 and a pixel defining layer 116 are formed on a base substrate 101 in sequence. The method further includes the following step: after the pattern including the active layer 103 and the storage electrode 104 is formed, a photoresist pattern by which the active layer 103 is sheltered but the storage electrode 104 is exposed is formed, so as to achieve the ion doping of the storage electrode 104, and then the photoresist pattern is removed.

SUMMARY

According to at least one embodiment of the present invention, there are provided an array substrate and manufacturing method thereof, a display device, a thin film transistor and manufacturing method thereof, so as to simplify the manufacturing method of the array substrate, improve the production efficiency, and enhance the yield of the array substrate.

According to at least one embodiment of the invention, there is provided a manufacturing method of an array substrate, which includes sequentially forming an active material layer, a gate insulating layer and a metal thin film on a base substrate, and patterning the active material layer, the gate insulating layer and the metal thin film by a first patterning process, so as to form a pattern including an active layer and a pattern including a gate electrode, a source electrode, a drain electrode, a gate line and a data line, with a part of the gate insulating layer being exposed at a periphery of the gate electrode, the gate line or the data line being disconnected at a intersection of the gate line and the data line; forming a passivation layer on the base substrate, and patterning the passivation layer by a second patterning process, so as to form a source contact hole, by which a part of the source electrode and a part of the active layer are exposed, a drain contact hole, by which a part of the drain electrode and a part of the active layer are exposed, and an bridge-structure contact hole, by which a part of disconnected gate line or data line is exposed; forming a transparent conductive thin film on the base substrate, and removing the transparent conductive thin film partially, so that a source contact section for electrically connecting the source electrode and the active layer is formed in the source contact hole, a drain contact section for electrically connecting the drain electrode and the active layer is formed in the drain contact hole, a pixel electrode electrically connected to the drain contact section is formed on the passivation layer above the drain electrode, and an bridge structure for electric connection of the disconnected gate line or data line is formed within the bridge-structure contact hole and over the passivation layer.

According to at least one embodiment of the invention, there is further provided an array substrate, which includes an active layer located on a base substrate; a gate insulating layer covering the active layer; a gate electrode, a source electrode, a drain electrode, a gate line and a data line located on the gate insulating layer and lying in the same film layer, wherein, a residual active material layer is formed between the source electrode and the base substrate, and between the drain electrode and the base substrate, respectively, the gate line or the data line is disconnected at a intersection of the gate line and the data line; a passivation layer covering the gate electrode, the source electrode, the drain electrode, the gate line and the data line; a source contact hole, a drain contact hole and bridge-structure contact hole that are located inside the passivation and the gate insulating layer, wherein, a part of the source electrode and a part of the active layer are exposed by the source contact hole, a part of the drain electrode and a part of the active layer are exposed by the drain contact hole, and a part of disconnected gate line or data line is exposed by the bridge-structure contact hole; a source contact section, a drain contact section, a pixel electrode and an bridge structure that lie in the same film layer, wherein, the source contact section is located inside the source contact hole, and configured for electrically connecting the source electrode and the active layer; the drain contact section is located inside the drain contact hole, and configured for electrically connecting the drain electrode and the active layer; the pixel electrode is located on the passivation layer above the drain electrode, and is electrically connected to the drain electrode through the drain contact section; and the bridge structure is located within the bridge-structure contact hole and on the passivation layer, and configured for electrically connecting the disconnected gate line or data line.

According to at least one embodiment of the invention, there is further provided a display device, which includes the array substrate as stated above.

According to at least one embodiment of the invention, there is further provided a thin film transistor, which includes an active layer located on a base substrate; a gate insulating layer covering the active layer; a gate electrode, a source electrode and a drain electrode that are located on the gate insulating layer and lie in the same film layer, wherein, a residual active material layer is formed between the source electrode and the base substrate, and between the drain electrode and the base substrate, respectively; a passivation layer covering the gate electrode, the source electrode and the drain electrode; a source contact hole and a drain contact hole that are located inside the passivation layer and the gate insulating layer, wherein, a part of the source electrode and a part of the active layer are exposed by the source contact hole, and a part of the drain electrode and a part of the active layer are exposed by the drain contact hole; a source contact section and a drain contact section lying in the same film layer, wherein, the source contact section is located inside the source contact hole, and configured for electrically connecting the source electrode and the active layer; and the drain contact section is located inside the drain contact hole, and configured for electrically connecting the drain electrode and the active layer.

According to at least one embodiment of the invention, there is further provided a manufacturing method of a thin film transistor, which includes sequentially forming an active material layer, a gate insulating layer and a metal thin film on a base substrate, patterning the active material layer, the gate insulating layer and the metal thin film by a first patterning process, so that a pattern including an active layer and a pattern including a gate electrode, a source electrode and a drain electrode are formed, and a part of the gate insulating layer is exposed at a periphery of the gate electrode; forming a passivation layer on the base substrate, patterning the passivation layer by a second patterning process, so that a source contact hole, by which a part of the source electrode and a part of the active layer are exposed, and a drain contact hole, by which a part of the drain electrode and a part of the active layer are exposed, are formed; forming a conductive thin film on the base substrate, removing a part of the conductive thin film, so as to form a source contact section for electrically connecting the source electrode and the active layer in the source contact hole and a drain contact section for electrically connecting the drain electrode and the active layer in the drain contact hole.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

As noticed by inventor(s) of the present application, the entire manufacturing process of the array substrate illustrated in FIG. 1 needs at least 8 to 9 patterning processes, and it is necessary for each patterning process to go through multiple procedures such as photoresist coating, exposure, development, cleaning and so on. This leads to the fact that the manufacturing steps of the array substrate are very miscellaneous, and the production efficiency is relatively low. Furthermore, a higher alignment precision is required during the patterning process, the difficulty of high-precision alignment is very big, and misalignment will directly bring about the degradation of product yield.

Embodiment 1

According to an embodiment of the invention, there is provided a manufacturing method of an array substrate, which includes the following steps S11 to S13.

Figure 2:
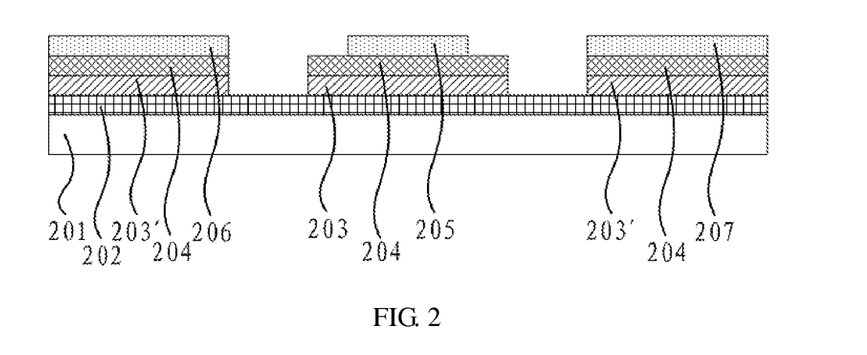
FIG. 2 to FIG. 4 are schematic views illustrating steps of a manufacturing method of an array substrate provided by Embodiment 1 of the invention.

Step S11, an active material layer, a gate insulating layer 204 and a metal thin film are sequentially formed on a base substrate 201, and the active material layer, the gate insulating layer 204 and the metal thin film are patterned by a first patterning process, so as to form a pattern including an active layer 203 and a pattern including a gate electrode 205, a source electrode 206, a drain electrode 207, a gate line (not illustrated in the figure) and a data line (not illustrated in the figure). Around the gate electrode 205, a part of the gate insulating layer 204 is exposed, and the gate line or the data line is disconnected at the intersection of the gate line and the data line, as illustrated in FIG. 2.

In the embodiment, for example, the above step S11 may include the following steps S111 to S115.

Figure 5:
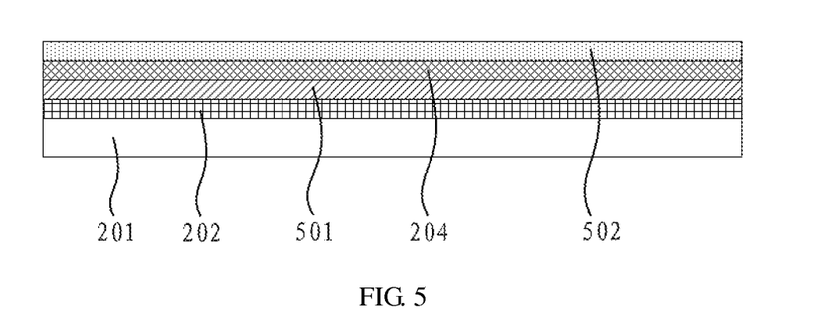
FIG. 5 to FIG. 9 are schematic views illustrating concrete steps of a step S11 in a manufacturing method of an array substrate provided by Embodiment 1 of the invention.

Step S111: an active material layer 501, a gate insulating layer 204 and a metal thin film 502 are sequentially formed on a base substrate 201, as illustrated in FIG. 5.

For the sake of ensuring that various properties of the product are more excellent, for example, it is possible that the base substrate 201 is initially cleaned to remove impurity particles remained on a surface of the base substrate during manufacture.

The concrete material of the provided base substrate 201 may be determined according to actual situations. If the display device required to be manufactured is not flexible, then for example, a glass substrate may be selected for the base substrate 201; if a flexible or bendable display device needs to be manufactured, then for example, the base substrate 201 may be of a plastic thin film or other material having the flexibility or bendability.

In the embodiment, as for the forming material of the active layer, different selections can be made according to actual requirements, and for example, amorphous silicon, polycrystalline silicon, oxide or other material may be chosen.

Taking the forming material of the active layer being polycrystalline silicon as an example, for example, forming the active material layer 501 in the embodiment may include that, an amorphous silicon material is deposited on a base substrate; and by adopting a crystallizing process, the amorphous silicon material is converted into a polycrystalline silicon material, so as to form the active material layer 501.

For example, it is possible that an amorphous silicon material is firstly deposited on a side of the base substrate by adopting sputtering process, PECVD or other deposition process, and then the amorphous silicon material is subjected to laser annealing crystallization, metal induced crystallization, solid phase crystallization or other crystallizing process to convert the amorphous silicon material into a polycrystalline silicon material, so that the active material layer 501 is formed. The thickness of the deposited amorphous silicon material is such as, in the range of 40 nm to 100 nm. In addition, after the end of deposition of the amorphous silicon material and prior to the crystallizing process, for example, it is possible that a dehydrogenation process is conducted on the amorphous silicon material with a heat-treatment furnace, so as to prevent the hydrogen decrepitation in the subsequent course of crystallization; after the end of crystallizing, for example, a dilute hydrofluoric acid solution may be used to clean the formed active material layer 501, so as to reduce the surface roughness of the active material layer 501.

After the active material layer 501 is formed, for example, doping of a thin-film-transistor channel may be performed on the active material layer 501 by using ion implantation, ion cloud implantation or other doping method, so as to adjust the threshold voltage of thin film transistors, and improve the switching characteristic of thin film transistors. The doping ions are, such as, $PH_3$ containing $H_2$ or $B_2H_6$ containing $H_2$, the range of ion implantation dosage is, such as, $10^{11}$-$13^{16}$ ions/cm$^2$, and the implantation energy is, such as, in the range of 10 Ke/V to 100 KeV.

In the embodiment, before the active material layer 501 is formed, for example, the manufacturing method of the array substrate may further include forming a buffer layer 202 on the base substrate 201.

For example, a silicon nitride thin film and a silicon oxide thin film may be sequentially formed on the base substrate 201 by using PECVD (Plasma Enhanced Chemical Vapor Deposition) or other process, and the laminated layer of the two thin films serves as the buffer layer 202. The thickness of the silicon nitride thin film is such as in the range of 50 nm to 100 nm, and the thickness of the silicon oxide thin film is such as in the range of 100 nm to 400 nm. The silicon nitride thin film has a strong diffusion barrier property, and can inhibit the effects of metal ions on a polycrystalline silicon thin film that is formed subsequently, and the silicon oxide thin film can form an excellent interface with the polycrystalline silicon thin film formed subsequently, so as to prevent the damage of drawbacks of the silicon nitride thin film to the quality of the polycrystalline silicon thin film.

It is to be noted that, the thickness of each film layer in the above buffer layer 202 is merely an exemplary scope provided by the embodiment, and in other embodiment of the invention, a specific setting different from the above exemplary scope may also be carried out on the thickness of each film layer in the buffer layer 202 according to actual situations.

The concrete structure of the buffer layer 202 in the embodiment is not merely limited to the laminated structure constituted by the silicon nitride thin film and the silicon oxide thin film, and it may also be a monolayered thin film structure or a laminated structure including at least three layers of thin films, and the forming material of the buffer layer 202 is not merely limited to the two kinds (i.e., silicon nitride and silicon oxide), either.

In addition, whether the buffer layer 202 is provided or not can be chosen according to actual situations, and in other embodiment of the invention, the buffer layer 202 may not be provided, either.

In this step, the process used for forming the gate insulating layer 204 may be, such as, PECVD or other process, and no limit will be set here.

The formed gate insulating layer 204 may be, such as, a laminated structured constituted by a silicon oxide thin film and a silicon nitride thin film, and the silicon oxide thin film is closer to the base substrate than the silicon nitride thin film. Thickness of the silicon oxide thin film may be, such as, in the range of 30 nm to 100 nm, and thickness of the silicon nitride thin film may be, such as, in the range of 20 nm to 100 nm. The gate insulating layer 204 may also be a monolayered thin film structure or a laminated structure including at least three layers of thin films.

It is to be noted that, the forming material of the gate insulating layer 204 may also be other insulating material than silicon oxide and silicon nitride; and, thickness of each layer of thin film constituting the gate insulating layer 204 is not merely limited to the above preferred range, and can be set according to actual situations.

In this step, for example, PECVD, magnetron sputtering or other process may be adopted for forming the metal thin film 502, and no limit will be set here.

Thickness of the metal thin film 502 may be set according to actual situations, and for example, it may be in the range of 200 nm to 500 nm. For example, the forming material of the metal thin film 502 may include at least one selected from a group consisting of aluminum, copper, molybdenum, titanium, compounds of aluminum and neodymium and so on or a combination of several substances selected from it. The metal thin film 502 may be a monolayered thin film structure, and may also be a laminated structure constituted by multilayer thin films, such as, a structure in which three layers of thin films of molybdenum, aluminum and molybdenum are laminated sequentially, a structure in which three layers of thin films of titanium, aluminum and titanium are laminated sequentially, or the like.

Figure 6:
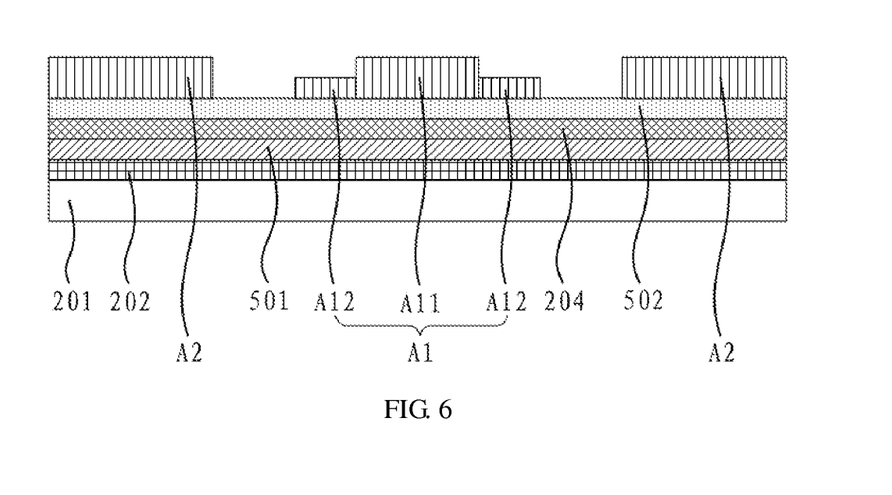

Step S112, with a semi-transmissive mask, a first photoresist layer A1 and a second photoresist layer A2 are formed on the metal thin film 502. The first photoresist layer A1 covers a region where an active layer is to be formed and a region where a gate line is to be formed, and includes a first portion A11 covering a region where a gate electrode is to be formed and the region where the gate line is to be formed and a second portion A12 around the first portion A11; the first photoresist layer A2 covers a region where a source electrode is to be formed, a region where a drain electrode is to be formed and a region where a data line is to be formed. Thicknesses of the first portion A11 of the first photoresist layer and the second photoresist layer A2 are each larger than thickness of the second portion A12 of the first photoresist layer, and the first photoresist layer A1 covering the region where a gate line is to be formed or the second photoresist layer A2 covering the region where the data line is to be formed is disconnected at the intersection of the two, as illustrated in FIG. 6.

In this step, no limit will be set to the concrete thicknesses of the first photoresist layer A1 and the second photoresist layer A2. Thickness of the first portion A11 of the first photoresist layer A1 may be, such as, in the range of 1 to 3 μm, thickness of the second portion A12 may be, such as, in the range of 0.5 to 1 μm, and thickness of the second photoresist layer A2 may be, such as, in the range of 1 to 3 μm. The first portion A11 of the first photoresist layer A1 and the second photoresist layer A2 may have the same thickness, and may have different thicknesses as well.

The first portion A11 of the first photoresist layer A1 covers a region where a gate electrode is to be formed and a region where a gate line is to be formed, and is useful for forming the gate electrode and the gate line in a subsequent step; the second portion A12 of the first photoresist layer A1 is located around the first portion A21, covers a region where an active layer is to be formed jointly with the first portion A11, and is useful for forming the active layer in a subsequent step; the second photoresist layer A2 covers a region where a source electrode is to be formed, a region where a drain electrode is to be formed, and a region where a data line is to be formed, and is useful for forming the source electrode, the drain electrode and the data line in a subsequent step.

It is to be noted that, in view of the fact that the gate line and the data line are formed in the same film layer in the embodiment, in order to avoid the gate line and the data line are connected and short-circuited, the first photoresist layer A1 covering a region where a gate line is to be formed or the second photoresist layer A2 covering a region where a data line is to be formed needs to be disconnected at the intersection of the two. Thus, in a subsequent step, a gate line or a data line that is disconnected at the intersection of the gate line and the data line is formed.

Figure 7:
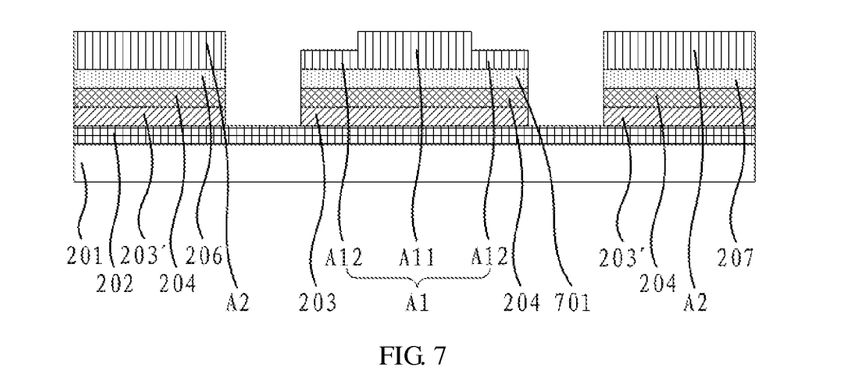

Step S113, with the first photoresist layer A1 and the second photoresist layer A2 as a mask, the exposed metal thin film and the gate insulating layer and the active material layer that are sheltered by the exposed metal thin film are removed, so as to form a pattern including an active layer 203 and a pattern including a source electrode 206, a drain electrode 207, a gate line and a data line, the gate line or the data line being disconnected at the intersection of the gate line and the data line, as illustrated in FIG. 7.

In this step, for example, film layers that are not protected by a photoresist layer may be consecutively etched by using plasma, inductive coupling or other dry-etching process, and for the etching, fully removing the active material layer not protected by photoresist is taken as an end point, so as to prevent degradation in transistor characteristics owing to joining of the active material layer.

It is to be noted that, the embodiment does not set a limit to the process method adopted for removing the exposed metal thin film and the gate insulating layer and the active material layer that are sheltered by the exposed metal thin film, and for example, a matching process may be selected based on the variances in the material for the metal thin film. For example, if the metal thin film is formed by laminating three thin films of molybdenum, aluminum and molybdenum sequentially, then for example, the above removing procedure may be carried on by using a wet etching method; if the metal thin film is formed by laminating titanium, aluminum and titanium sequentially, then for example, the above removing procedure may be carried on by using inductive coupling plasma etching method.

After the step S113 is conducted, a source electrode 206, a drain electrode 207, a gate line and a data line are formed, but a gate electrode has not been formed, and the metal thin film covering a region where a gate electrode is to be formed serves as a layer 701 in which the gate electrode is to be formed. Because it is necessary for each of the source electrode 206 and the drain electrode 207 to be electrically connected to the active layer 203, and at this time, the layer 701 in which the gate electrode is to be formed completely covers the active layer 203, the layer 701 in which the gate electrode is to be formed needs to be partially removed in a subsequent step to form the gate electrode, so that it only covers a part of the active layer 203.

In the embodiment, in the step of forming the pattern that includes the active layer 203, for example, a pattern including a storage electrode may be formed at the same time. The storage electrode acts to form a storage capacitor together with a pixel electrode formed subsequently, so as to maintain the display of picture of the previous frame upon picture switching between two frames.

It is to be noted that, the residual active material layer 203' illustrated in the figure is other portion than a portion for forming the active layer 203 in the remaining part of the active material layer 501 after it is subjected to the above step S113. Because the active layer, the gate electrode, the source electrode and the drain electrode are formed simultaneously only by one patterning process in the embodiment, the residual active material layer 203' is formed between the source electrode 206 and the base substrate 201, and between the drain electrode 207 and the base substrate, respectively.

Figure 8:
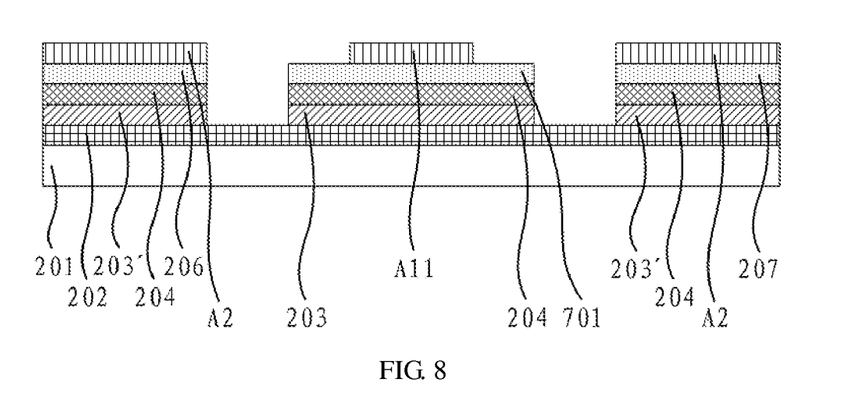

Step S114, the second portion A12 of the first photoresist layer is removed, as illustrated in FIG. 8.

In this step, for example, the second portion A12 of the first photoresist layer A1 may be removed by using a plasma ashing process. In the course of ashing removal, the first portion A11 of the first photoresist layer A1 and the second photoresist layer A2 will also be removed by a certain amount simultaneously. However, because the thicknesses of the first portion A11 of the first photoresist layer A1 and the second photoresist layer A2 are each greater than thickness of the second portion A12 of the first photoresist layer A1, after the end of the ashing removal process, a region where a gate electrode is to be formed and the gate line are still masked by the first portion A11, the source electrode 206, the drain electrode 207 and the data line are still covered by the second photoresist layer A2, and only a surface of the metal thin film (the layer 701 in which the gate electrode is to be formed) around the region where the gate electrode is to be formed is exposed.

Figure 9:
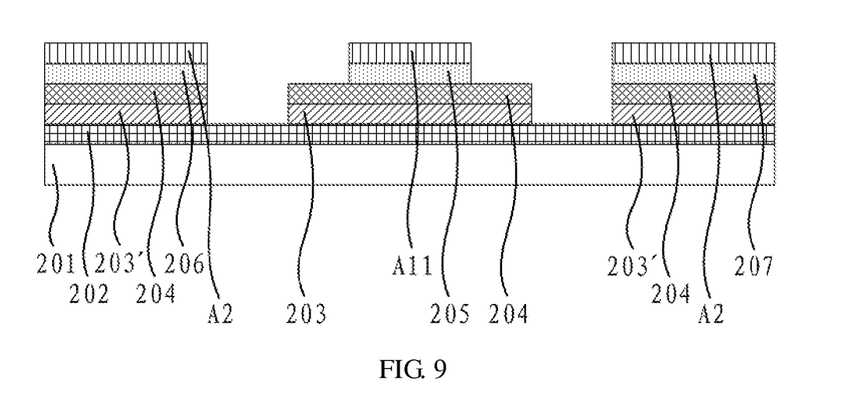

Step S115, with the first portion A11 of the first photoresist layer and the second photoresist layer A2 as a mask, the metal thin film around the first portion A11 of the first photoresist layer is removed, to form pattern including a gate electrode 205, and at the periphery of the gate electrode 205, a part of the gate insulating layer 204 is exposed, as illustrated in FIG. 9.

In this step, for example, the metal thin film (the layer 701 in which the gate electrode is to be formed) around the region where the gate electrode is to be formed (i.e. the first portion A11 of the first photoresist layer) may be removed by using a wet etching or dry etching process, and the remaining metal thin film forms the gate electrode 205.

Because the source electrode 206 and the drain electrode 207 will be electrically connected to the active layer 203, the active layer covered by the gate insulating layer around the gate electrode serves as a region for ohmic contact with the source electrode 206 and the drain electrode 207. Based on the consideration of reducing the ohmic contact resistance, in the embodiment, after the pattern including the gate electrode 205 is formed, in the manufacturing method of the array substrate, for example, the following operations may further be performed: with the gate electrode 205 as a mask, the active layer 203 around the gate electrode 205 is doped; annealing is conducted on the base substrate, so as to activate the doped impurity. With the aid of the doping process, the conductive characteristic of the doped region (i.e., the active layer functioning as a source/drain contact region) can be reduced, thereby reducing the ohmic contact resistance.

It is to be noted that, for example, ion implantation or ion cloud implantation method may be used for the above doping process. The doping ions may be $PH_3$ containing $H_2$ or $B_2H_6$ containing $H_2$, ion implantation dosage may be in the range of $10^{15}$~$10^{16}$ ions/cm$^2$, and the implantation energy may be in the range of 10 to 100 KeV.

It is to be noted that, after the whole step S11 is finished, the remaining photoresist layer (the first portion A11 of the first photoresist layer and the second photoresist layer A2) may be removed.

In the embodiment, the active material layer 501, the gate insulating layer 204 and the metal thin film 502 are consecutively formed on a base substrate. The first photoresist layer A1 and the second photoresist layer A2 are formed by using patterning process with a semi-transmissive mask, so that a region where a gate electrode and a gate line are to be formed is masked by a thicker portion of the first photoresist layer A1, and a region where an active layer is to be formed around a region where the gate electrode is to be formed is masked by a thinner portion of it; the second photoresist layer A2 covers a region where a source electrode, a drain electrode and a data line are to be formed, and its thickness is greater than the thickness of the thinner portion of the first photoresist layer A1. Then, the exposed metal thin film and the gate insulating layer and the active material layer that are covered by it are removed, so as to form the active layer 203, the source electrode 206, the drain electrode 207, the gate line and the data line. After that, the thinner portion of the first photoresist layer A1 is removed, so as to expose the metal thin film around the region where the gate electrode is to be formed, and that part of the metal thin film is removed, to form the gate electrode 205. As can be seen, through the above step S11 (step S111 to step S115), forming the active layer 203, the gate electrode 205, the source electrode 206, the drain electrode 207, the gate line and the data line with the same patterning process is achieved, and a patterning process required for forming an active layer, a patterning process required for forming a gate electrode and a gate line and a patterning process required for forming a source electrode, a drain electrode and a data line are merged into one patterning process. Thus, the manufacturing method of the array substrate is simplified, and moreover, a problem of alignment deviation caused by a larger difficulty of multiple patterning alignments is ameliorated, and yield of the array substrate is enhanced.

Figure 3:
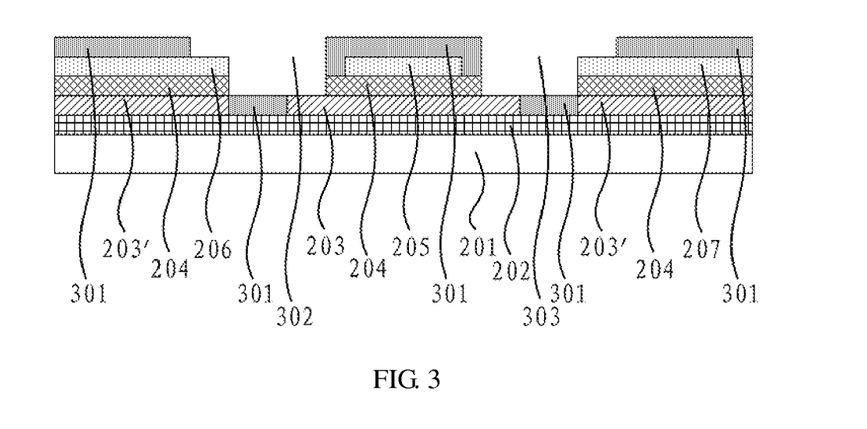

Step S12, a passivation layer 301 is formed on the base substrate, and is patterned by a second patterning process, so as to form a source contact hole 302, by which a part of the source electrode 206 and a part of the active layer 203 are exposed, a drain contact hole 303, by which a part of the drain electrode 207 and a part of the active layer 203 are exposed, and an bridge-structure contact hole, by which a part of a disconnected gate line or data line is exposed, as illustrated in FIG. 3.

In the embodiment, the above step S12, for example, may include the following steps S121 to S123.

Figure 10:
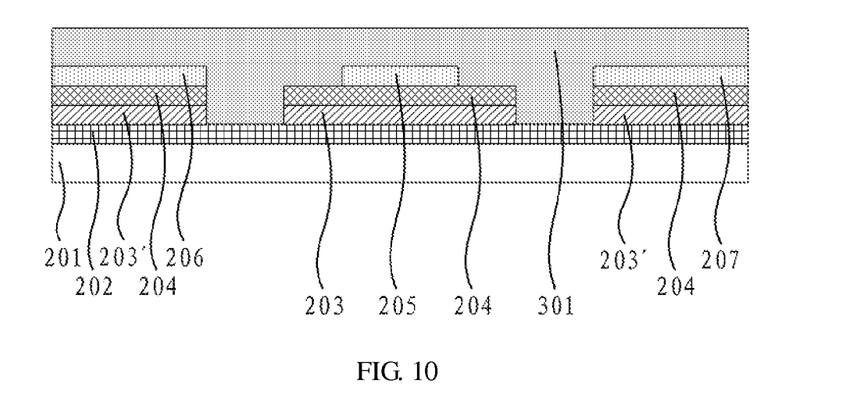
FIG. 10 to FIG. 12 are schematic views illustrating concrete steps of a step S12 in a manufacturing method of an array substrate provided by Embodiment 1 of the invention.

Step S121, a passivation layer 301 is formed on the base substrate, as illustrated in FIG. 10.

For example, the process of forming the passivation layer 301 may include that, firstly, a passivation layer material containing hydrogen is deposited on a side of the base substrate 201 facing away from the pattern that includes the gate electrode 205, the source electrode 206, the drain electrode 207, the gate line and the data line, and then, rapid thermal annealing, heat treatment furnace annealing or other annealing process is conducted, so that hydrogen gets into the interior of the active layer 203, to repair bulk defects inside it, and gets into an interface between the active layer 203 and other film layer, to repair interfacial defects. Thus, a goal of improving characteristics of TFTs is achieved.

Material for the passivation layer 301, for example, may be a silicon nitride thin film containing hydrogen, and its thickness, for example, may be in the range of 200 nm to 500 nm.

Figure 11:
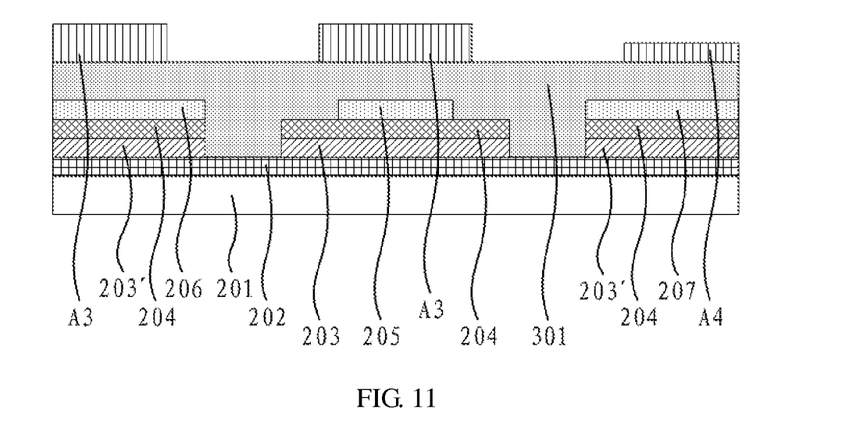

Step S122: a third photoresist layer A3 that covers the gate electrode 205, the source electrode 206, the gate line and the data line and a fourth photoresist layer A4 that covers the drain electrode 207 are formed on the passivation layer 301, and thickness of the third photoresist layer A3 is larger than thickness of the fourth photoresist layer A4, as illustrated in FIG. 11.

In this step, a semi-transmissive mask (e.g., a half-tone mask, a gray-tone mask, or the like) with pattern of a source contact hole to be formed and pattern of a drain contact hole to be formed may be used. By utilizing the property that specific zones on a semi-transmissive mask have different light transmittances, photoresist layers with different thicknesses are formed on the passivation layer 301, and thickness of the third photoresist layer A3 is larger than thickness of the fourth photoresist layer A4.

Thickness of the third photoresist layer A3, for example, may be in the range of 1 μm to 3 μm, and thickness of the fourth photoresist layer A4, for example, may be in the range of 0.5 μm to 1 μm.

Figure 12:
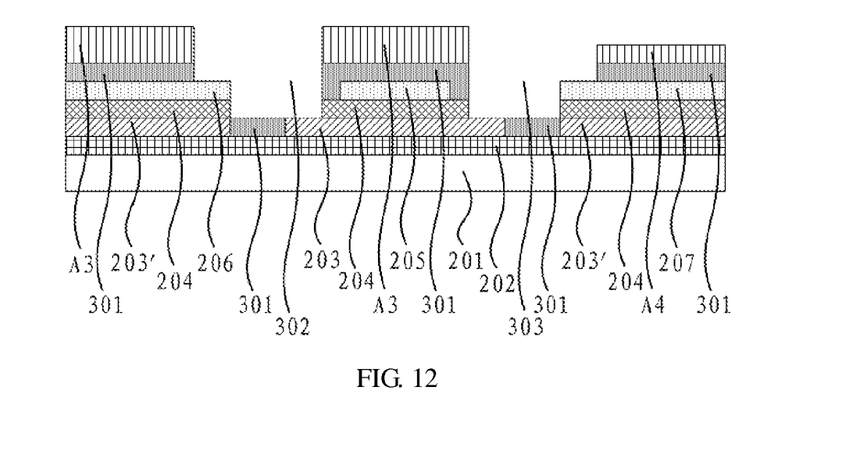

Step S123, with the third photoresist layer A3 and the fourth photoresist layer A4 as a mask, the exposed passivation layer is removed, so as to form a source contact hole 302, by which a part of the source electrode 206 and a part of the active layer 203 are exposed, a drain contact hole 303, by which a part of the drain electrode 207 and a part of the active layer 203 are exposed, and an bridge-structure contact hole, by which a part of the disconnected gate line or data line is exposed, as illustrated in FIG. 12.

In the above step, for example, a dry etching process may be used for etching of the source contact hole, the drain contact hole and the bridge-structure contact hole. In the beginning, the exposed passivation layer 301 is etched. When the etching proceeds to a surface of the film layer in which the source electrode 206, the source electrode 207, the gate line and the data line are located, because etching rates for different materials are different, and the forming material (usually being metal) of the source electrode 206, the drain electrode 207, the gate line and the data line has an extremely small etching selective ratio to the passivation layer material, the material for the source electrode 206, the drain electrode 207, the gate line and the data line will not be removed or merely removed by an extremely small amount, while the passivation layer material, which falls within a region where a source contact hole is to be formed, a region where a drain contact hole is to be formed, and a region where an bridge-structure contact hole is to be formed, in the film layer where the source electrode 206, the drain electrode 207, the gate line and the data line are located is etched off, so as to form stepwise structures at the source electrode 206 and the drain electrode 207. Partial surfaces of the two are exposed, and moreover, a disconnected gate line or data line is partially exposed, thereby forming an bridge-structure contact hole. In the course of etching still further downward, material for the gate insulating layer 204, which is not sheltered by the source electrode 206 and the drain electrode 207 and lies within a region where a source contact hole is to be formed and a region where a drain contact hole is to be formed, is removed. The etching is not ended until a surface of the active layer is exposed, and a source contact hole 302 and a drain contact hole 303 are formed.

In this step, the used dry etching process, for example, may be inductive coupling plasma etching or other etching process.

It is to be noted that, at the same time of removing the exposed passivation layer in this step, the gate insulating layer that is covered by the exposed passivation layer and around the gate electrode 205 is also removed.

Figure 4:
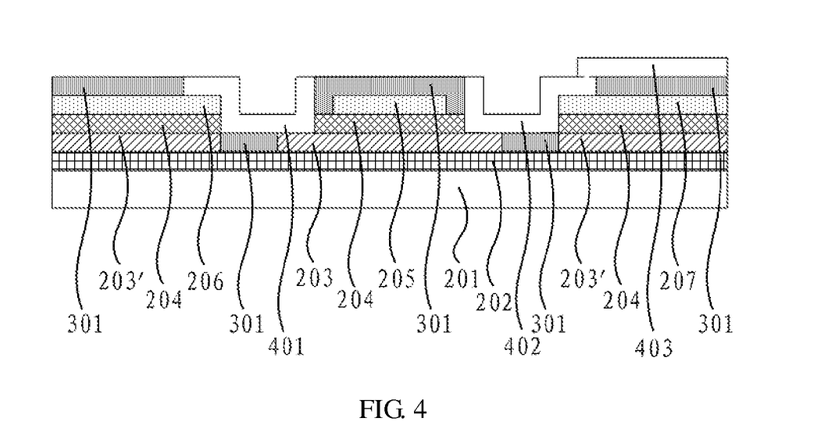

Step S13: a transparent conductive thin film is formed on the base substrate, and a part of the transparent conductive thin film is removed by a thin film stripping process, so as to form a source contact section 401 for electrically connecting the source electrode 206 and the active layer 203 in the source contact hole, to form a drain contact section 402 for electrically connecting the drain electrode 207 and the active layer 203 in the drain contact hole, to form a pixel electrode 403 electrically connected to the drain contact section 402 on the passivation layer 301 above the drain electrode 207, and to form an bridge structure for electrical connection of a disconnected gate line or data line within the bridge-structure contact hole and over the passivation layer, as illustrated in FIG. 4.

For example, the above S13 may include the following steps S131 to S133.

Figure 13:
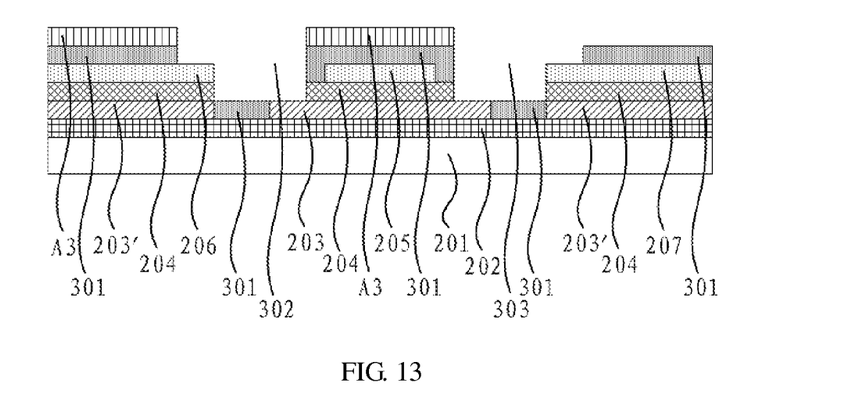
FIG. 13 to FIG. 15 are schematic views illustrating concrete steps of a step S13 in a manufacturing method of an array substrate provided by Embodiment 1 of the invention.

Step S131: the fourth photoresist layer A4 is removed, as illustrated in FIG. 13.

In this step, for example, the fourth photoresist layer A4 may be removed by plasma ashing or other ashing process. As thickness of the third photoresist layer A3 is larger than that of the fourth photoresist layer A4, during removal of the photoresist layer, although the third photoresist layer A3 is removed partially, a certain thickness is still left over to cover the gate electrode 205, the source electrode 206, the gate line and the data line. The remaining third photoresist layer A3 will serve as a stripped layer in a subsequent step.

Figure 14:
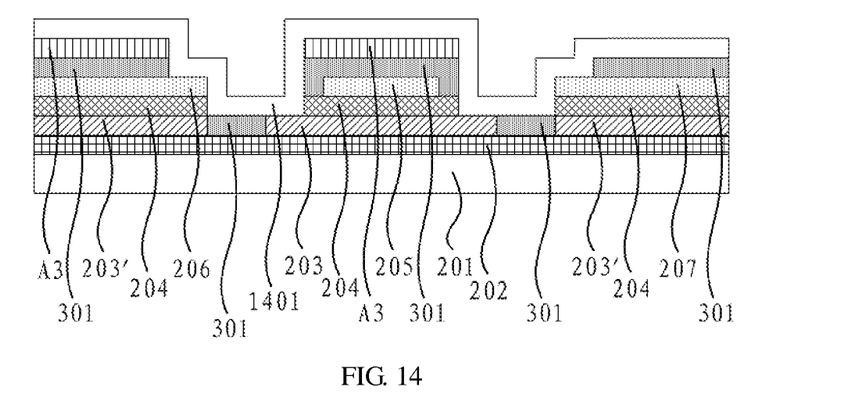

Step S132, a transparent conductive thin film 1401 is formed on the base substrate, as illustrated in FIG. 14.

In this step, for example, magnetron sputtering, chemical vapor deposition or other process may be used for forming the transparent conductive thin film 1401.

Thickness, forming material and concrete configuration of the transparent conductive thin film 1401 may be correspondingly selected according to actual requirements, and the embodiment will not set a limit to this. Its thickness range may be, such as, 20 nm to 150 nm, the forming material may be, such as, one selected from the grouping consisting of ITO (Indium Tin Oxide), IZO (Indium Zinc Oxide), ZTO (Zinc Tin Oxide), Ag, Al, Au and so on or a combination of multiple substances selected therefrom, and the concrete configuration may be, such as, a monolayered thin film structure or a composite structure constituted by multiple layers of thin films.

For example, if the manufactured array substrate is applied to a bottom-emission AMOLED display device, then the transparent conductive thin film 1401 is, such as, ITO (Indium Tin Oxide), IZO (Indium Zinc Oxide), ZTO (Zinc Tin Oxide) or other oxide transparent conductive thin film, and its thickness is, such as, 20 nm to 100 nm. If the manufactured array substrate is applied to a top-emission AMOLED display device, then the transparent conductive thin film 1401 is, such as, a composite thin film constituted by an ITO thin film, an Ag thin film and an ITO thin film, a composite thin film constituted by an IZO thin film and an Ag thin film, or other composite thin film, and in the transparent conductive thin film 1401, thickness of the ITO thin film is, such as, 10 nm to 50 nm, and thickness of the Ag thin film is, such as, 20 nm to 100 nm.

Figure 15:
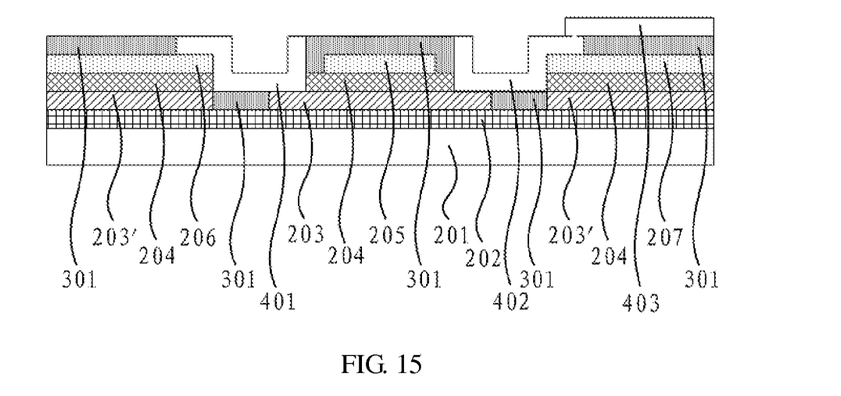

Step S133, the third photoresist layer A3 is stripped off, so that the transparent conductive thin film covering the third photoresist layer A3 is removed, a source contact section 401 for electrically connecting the source electrode 206 and the active layer 203 is formed in the source contact hole 302, a drain contact section 402 for electrically connecting the drain electrode 207 and the active layer 203 is formed in the drain contact hole, a pixel electrode 403 electrically connected to the drain contact section 402 is formed on the passivation layer 301 above the drain electrode 207, and an bridge structure for electrical connection of a disconnected gate line or data line is formed within the bridge-structure contact hole and on the passivation layer, as illustrated in FIG. 15.

For example, it is possible that the base substrate on which the transparent conductive thin film 1401 has been formed completely is placed into a stripping machine, and the residual third photoresist layer A3 is removed with a photoresist stripping solution. By the thin film stripping process, the transparent conductive thin film covering the third photoresist layer A3 is removed simultaneously, and the transparent conductive thin film at the source contact hole 302, the drain contact hole 303 and lying within the region where a pixel electrode is to be formed is preserved. The transparent conductive thin film within the source contact hole 302 serves as a source contact section 401 for electrically connecting the source electrode 206 and the active layer 203, the transparent conductive thin film within the drain contact hole 303 serves as a drain contact section 402 for electrically connecting the drain electrode 207 and the active layer 203, and the transparent conductive thin film adjacent to the drain electrode 207 and over the passivation layer 301 within the region where the pixel electrode is to be formed serves as the pixel electrode 403 for electric connection to the drain electrode 207. For example, the pixel electrode 403 may be formed into a storage capacitor jointly with a storage electrode, for maintaining the display of picture of the previous frame during picture switching between two adjacent frames.

Figure 16:
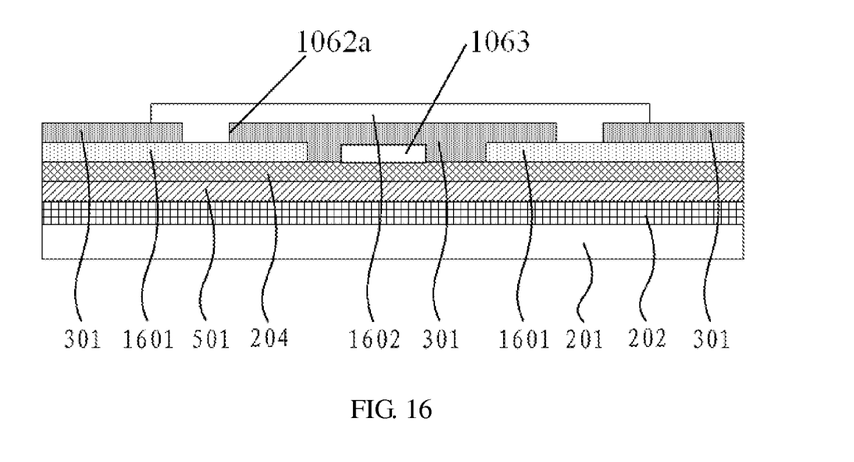
FIG. 16 is a schematic view illustrating the step for a data line with disconnected electrical connection in a manufacturing method of an array substrate provided by Embodiment 1 of the invention.

It is to be noted that, in the embodiment, the gate line and the data line are formed in the same photolithographic step as the gate electrode 205, the source electrode 206 and the drain electrode 207, and at the intersection of the data line and the gate line, it is necessary for the data line or the gate line to be disconnected. The following case is taken as an example: a gate line is continuous, and a data line is disconnected at the intersection with the gate line. As illustrated in FIG. 16, after deposition of the passivation layer 301 is finished, an bridge-structure contact hole needs to be made at the disconnection, and then, an bridge-structure 1602 is adopted for electrical connection of the disconnected data line 1601, so as to achieve the electrical insulation between the data line 1601 and the gate line 1603. An bridge-structure contact hole 1602a needed making for electric connection of the disconnected data line 1601 is formed simultaneously with the source contact hole 302 and the drain contact hole 303, and the bridge-structure 1602 that fills the bridge-structure contact hole and is useful for electrical connection of the disconnected data line 1601 is formed of a partially transparent conductive thin film 1401. While the transparent conductive thin film 1401 is formed, a transparent conductive thin film material is filled in the bridge-structure contact hole, and while the third photoresist layer A3 is stripped off, the transparent conductive thin film material around the bridge-structure 1602 needing stripping is stripped off. Thereby, the bridge-structure 1602 for electrical connection of the disconnected data line 1601 is formed.

In the embodiment, from the above step S12 (step S121 to step S123) to step S13 (step S131 to step S133), firstly, photoresist layers with different thicknesses are formed with a semi-transparent mask, and are etched to form a source contact hole and a drain contact hole, then, a photoresist layer lying in a region where a pixel electrode is to be formed and with a thinner thickness is removed, after that, a transparent conductive thin film is formed, a photoresist layer lying over the source electrode 206 and the gate electrode 205 and with a thicker thickness and the transparent conductive thin film covering it are removed by a thin film stripping process, so as to form a pixel electrode 403, and achieve electrical connections between the source electrode 206 and the drain electrode 207 and the active layer 203. Thus, two patterning steps necessary for formation of a source contact hole and a drain contact hole and formation of a pixel electrode contact hole in the manufacturing method of an array substrate illustrated in FIG. 1 are merged into one, the manufacturing steps of the array substrate are simplified, and the production efficiency is enhanced. Furthermore, owing to reduction in the use number of patterning processes, a problem of alignment deviation caused by multiple patterning steps can be avoided to a certain extent, and the yield of products is enhanced.

After the end of formation of the source contact portion 401, the drain contact portion 402 and the pixel electrode 403, the manufacturing method of the array substrate provided by the embodiment may further include, such as, a step of forming a pixel defining layer on the base substrate.

For example, a pixel defining layer material is deposited on the base substrate subjected to the step S13, and a photoresist mask with pattern of a pixel defining layer is formed by using a patterning process. An etching is conducted to remove the pixel defining layer material except that to be formed into a pixel defining layer, thereby forming the pixel defining layer.

For example, acryl or other material may be used as forming material of the pixel defining layer, and its thickness may be, such as, 1 μm to 4 μm.

After the end of fabrication of the pixel defining layer, for example, rapid thermal annealing furnace or heat treatment furnace may be used for annealing treatment of the completed array substrate, so as to stabilize characteristics of TFTs.

It is to be noted that, the manufacturing method provided in the embodiment is applicable for manufacture of LTPS TFT array substrates, but this cannot be construed as limiting the application scope of the manufacturing method provided by the embodiment. On the premise that core idea of the present invention does not change, the manufacturing method provided by the embodiment is also applicable for manufacture of amorphous silicon TFT array substrates, HTPS TFT array substrates, oxide TFT array substrate, organic TFT array substrates and so on.

In the manufacturing method of the array substrate provided by the embodiment, the active layer, the gate electrode, the source electrode, the drain electrode, the gate line and the data line are simultaneously formed only by one patterning process, and an interlayer insulating layer between the gate electrode and source and drain electrodes is omitted. Thus, patterning processes required to be used for forming an active layer, for forming a gate electrode and a gate line, and for forming source and drain electrodes and a data line in the manufacturing method of an array substrate illustrated in FIG. 1 are merged into one.

Furthermore, a source contact hole and a drain contact hole, bottoms of which have a stepwise structure, are formed merely by one patterning process according to the embodiment, and meanwhile an bridge-structure contact hole is formed. And, by one-time deposition of a transparent conductive thin film combined with a thin film stripping process, electrical connections between a source electrode and a drain electrode and an active layer and electrical connection of a disconnected gate line or data line are achieved while a pixel electrode is formed. Thus, two patterning processes necessary for formation of a source contact hole and a drain contact hole and formation of a pixel-electrode contact hole in the manufacturing method of an array substrate illustrated in FIG. 1 are merged into one.

As can be seen, with the manufacturing method provided by the embodiment, 8 to 9 patterning processes necessary for the manufacturing method of an array substrate illustrated in FIG. 1 can be reduced to be 3, thereby simplifying the manufacturing steps of the array substrate, and enhancing the production efficiency. Furthermore, due to reduction in the use number of patterning processes, an alignment deviation caused by multiple high-precision alignments of multiple photolithographies can be effectively improved, and yield of products is raised.

Embodiment 2

Figure 17:
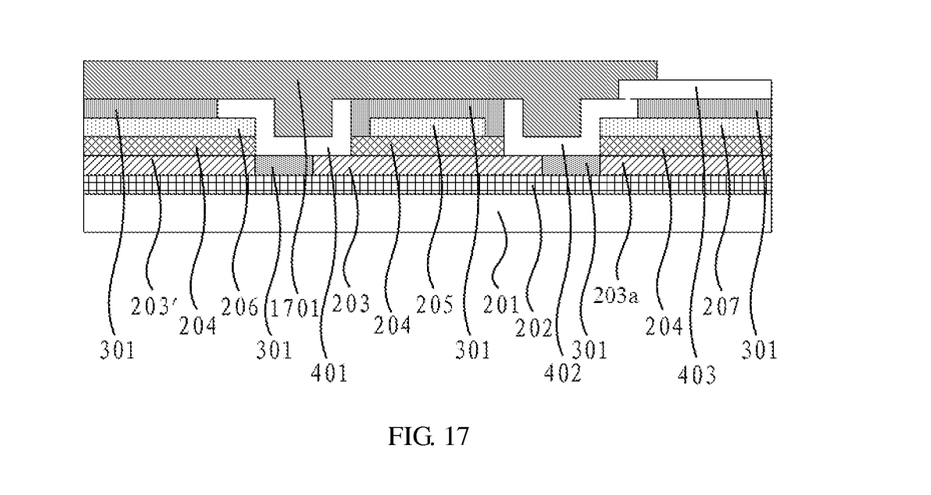
FIG. 17 is a basic structural view illustrating an array substrate provided by Embodiment 2 of the invention.

According to the embodiment, there is provided an array substrate. As illustrated in FIG. 17, the array substrate provided by the embodiment includes an active layer 203 located on a base substrate 201; a gate insulating layer 204 covering the active layer 203; a gate electrode 205, a source electrode 206, a drain electrode 207, a gate line and a data line, which are located on the gate insulating layer 204 and lies in the same film layer, with a residual active material layer 203' being formed between the source electrode 206 and the base substrate 201, and between the drain electrode 207 and the base substrate 201, respectively, with the gate line or the data line being disconnected at the intersection of the gate line and the data line; a passivation layer 301, which covers the gate electrode 205, the source electrode 206, the drain electrode 207, the gate line and the data line; a source contact hole, a drain contact hole and an bridge-structure contact hole that are located inside the passivation layer 301 and the gate insulating layer 204, a part of the source electrode 206 and a part of the active layer 203 being exposed by the source contact hole, a part of the drain electrode 207 and a part of the active layer 203 being exposed by the drain contact hole, and a part of the disconnected gate line or data line being exposed by the bridge-structure contact hole; a source contact section 401, a drain contact section 402, a pixel electrode 403 and an bridge structure lying in the same film layer. The source contact section 401 is located inside the source contact hole, and electrically connects the source electrode 206 and the active layer 203, the drain contact section 402 is located inside the drain contact hole, and electrically connects the drain electrode 207 and the active layer 203, the pixel electrode 403 is located on the passivation layer 301 above the drain electrode 207, and electrically connected to the drain electrode 207 through the drain contact section 402, and the bridge structure is located within the bridge-structure contact hole and on the passivation layer, and configured for electric connection of the disconnected gate line or data line.

The positional relationship between the active layer 203, the gate insulating layer 204, the gate electrode 205, the source electrode 206, the drain electrode 207, the gate line, the data line and the passivation layer 301 may be, such as, that illustrated in FIG. 17. That is, the active layer 203 is located on the base substrate 201, the gate insulating layer 204 is located on a side of the active layer facing away from the base substrate 201, the gate electrode 205, the source electrode 206, the drain electrode 207, the gate line and the data line are located on a side of the gate insulating layer 204 facing away from the base substrate 201, and the passivation layer 301 is located on a side of the gate electrode 205, the source electrode 206, the drain electrode 207, the gate line and the data line facing away from the base substrate 201.

It is to be noted that, descriptions have been made merely with the positional relationship between the above-mentioned film layers illustrated in FIG. 17 as an example in the embodiment, in other embodiments of the invention, there may also be other change in the positional relationship between the active layer 203, the gate insulating layer 204, the gate electrode 205, the source electrode 206, the drain electrode 207, the gate line, the data line and the passivation layer 301 as stated above.

The gate electrode 205, the source electrode 206, the drain electrode 207, the gate line, and the data line provided by the embodiment lie in the same film layer, and therefore, there is no overlapping part between the gate electrode 205 and the source electrode 206 and the drain electrode 207, i.e., there is no parasitic capacitance between the gate electrode 205 and the source electrode 206 and the drain electrode 207. While for the array substrate illustrated in FIG. 1, as a gate electrode and source and drain electrodes are located in different film layers, overlapping between the gate electrode and source and drain electrodes results in generation of parasitic capacitances, and in turn, the electrical performance of the device is affected. As can be seen, the parasitic capacitance of the array substrate in the embodiment is relatively smaller, and the electrical performance is more excellent. And, an interlayer insulating layer between a gate electrode and source and drain electrodes is omitted when the above structure is compared to the array substrate illustrated in FIG. 1, thereby decreasing the usage amount of materials to a certain extent, and reducing the production cost.

Furthermore, as can be seen from Embodiment 1, the array substrate in the embodiment can be formed by using fewer patterning processes, and therefore, the array substrate provided by the embodiment has the merits of simple manufacturing method and high production efficiency.

Besides, a patterning process requires a higher alignment precision, a high alignment precision makes the difficulty of alignment larger, and multiple patterning steps are very prone to cause a variance in alignment, resulting in degradation in the yield of products. Because the array substrate in the embodiment can be manufactured by using fewer patterning processes, and a problem of misalignment can be ameliorated by decreasing the number of patterning, the array substrate provided by the embodiment has a higher yield.

It is to be noted that, 203' illustrated in figures is other part than that for forming the active layer 203 in the remaining portion of the active material layer 501 after it is partially etched.

The forming material of the active layer 203 in the embodiment is, such as, polycrystalline silicon.

The embodiment does not set a limit to material for the gate electrode 205, the source electrode 206, the drain electrode 207, the gate line and the data line, material of the three may include, such as, at least one selected from the group consisting of aluminum, copper, molybdenum, titanium, aluminum-neodymium compounds and so on or a combination of several substances selected from it, so as to achieve a better conductive effect.

In addition, in the embodiment, thicknesses of the source contact section 401, the drain contact section 402, the pixel electrode 403 and the bridge structure are, such as, in the range of 20 nm to 150 nm, so as to achieve a better conductive effect.

Relative to an array substrate, production of a planarizing layer can be omitted from the array substrate in the embodiment after formation of the passivation layer 301 is finished, so as to save the material, reduce the cost and simplify the process. Based on this idea, for example, the same material as that for a planarizing layer (e.g. acryl) can be chosen as material for the passivation layer 301 in the embodiment, so that a surface of the base substrate is planarized while upper and lower film layers of the planarizing layer are isolated.

For example, the array substrate provided by the embodiment may further include a storage electrode 203a disposed in the same layer as the active layer 203. As illustrated in FIG. 17, the storage electrode may be, for example, formed in the same step as the active layer 203, and overlaps with the pixel electrode 403 to form a storage capacitor, which is useful for maintaining the display of picture of the previous frame upon picture switching between two frames.

In the embodiment, for example, the array substrate may further include a buffer layer 202 located between the base substrate 201 and the active layer 203, so as to protect the base substrate 201. The buffer layer 202 may include, such as, a silicon nitride thin film and a silicon oxide thin film, and for example, the silicon nitride thin film may be closer to the base substrate 201 than the silicon oxide thin film. The silicon nitride thin film has a very strong diffusion barrier property, and is capable of inhibiting the impact of metal ions on a subsequently formed polysilicon thin film, and the silicon oxide thin film can form a good interface with the subsequently formed polysilicon thin film, so as to prevent damage of defects of the silicon nitride thin film to quality of the polysilicon thin film.

In addition, the array substrate provided by the embodiment may further include, such as, a pixel defining layer 1701 covering the source contact section 401, the drain contact section 402 and the bridge structure. The pixel defining layer 1701 serves to maintain that the source electrode 206 and the drain electrode 207 and a film layer formed on the pixel defining layer 1701 are electrically insulated from each other, and the pixel defining layer 1701 is formed around the pixel electrode 403, and also useful for defining pixel regions. The pixel defining layer 1701 may adopt the same material as the planarizing layer, and for example, it may adopt acryl or other material, so as to planarize a surface of the base substrate.

The array substrate provided by the embodiment may be, such as, a LTPS TFT array substrate, and in other embodiments of the invention, it may also be an amorphous silicon TFT array substrate, a HTPS TFT array substrate, an oxide TFT array substrate, an organic TFT array substrate or the like. No limit will be set here.

Embodiment 3

Based on Embodiment 2, a display device that includes the array substrate as stated in Embodiment 2 is provided by the embodiment.

For example, the display device provided by the embodiment may be an OLED (Organic Light Emitting Diode) display device, such as, an AMOLED (Active Matrix Organic Light Emitting Diode) display device; and it may also be a LCD (Liquid Crystal Display), such as, an IPS (In-Plane Switching) mode LCD, or the like.

Because a gate electrode and source and drain electrodes of a TFT for the display device provided by the embodiment lies in the same film layer, no parasitic capacitance exists between the gate electrode and the source and drain electrodes. Thus, the performance of the display device is improved.

Furthermore, as the array substrate for the display device in the embodiment can be manufactured and formed by using fewer patterning processes, the production efficiency of the display device is higher; besides, a problem of misalignment can be ameliorated by means of reducing the patterning number, and therefore, the display device in the embodiment has a higher yield.

In addition, because no interlayer insulating layer exists between the gate electrode and a pattern including source and drain electrodes, and use of the material is cut down, the production cost of the display device in the embodiment is reduced, and the process steps are simplified.

Embodiment 4

According to an embodiment of the invention, there is provided a thin film transistor, which includes an active layer located on a base substrate; a gate insulating layer covering the active layer; a gate electrode, a source electrode and a drain electrode, which are located on the gate insulating layer and lie in the same film layer, with a residual active material layer being formed between the source electrode and the base substrate, and between the drain electrode and the base substrate, respectively; a passivation layer covering the gate electrode, the source electrode and the drain electrode; a source contact hole and a drain contact hole, which are located inside the passivation layer and the gate insulating layer, a part of the source electrode and a part of the active layer being exposed by the source contact hole, and a part of the drain electrode and a part of the active layer being exposed by the drain contact hole; and a source contact section and a drain contact section lying in the same film layer. The source contact section is located inside the source contact hole, and configured for electrically connecting the source electrode and the active layer; and the drain contact hole is located inside the drain contact hole, and configured for electrically connecting the drain electrode and the active layer.

According to an embodiment of the invention, there is provided a manufacturing method of a thin film transistor including that, an active material layer, a gate insulating layer and a metal thin film are sequentially formed on a base substrate, the active material layer, the gate insulating layer and the metal thin film are patterned by a first patterning process, so as to form a pattern including an active layer and a pattern including a gate electrode, a source electrode and a drain electrode, with a part of the gate insulating layer being exposed at the periphery of the gate electrode; a passivation layer is formed on the base substrate, and is patterned by a second patterning process, so as to form a source contact hole, by which a part of the source electrode and a part of the active layer are exposed, and a drain contact hole, by which a part of the drain electrode and a part of the active layer are exposed; a conductive thin film is formed on the base substrate, and is partially removed, so as to form a source contact section for electrically connecting the source electrode and the active layer in the source contact hole, and to form a drain contact section for electrically connecting the drain electrode and the active layer in the drain contact hole. In an example, the above-mentioned transparent conductive thin film may be used as the conductive thin film.

Regarding implementation of manufacturing method of the thin film transistor in the embodiment, reference can be made to relevant descriptions of the above array substrate, and repetitions are omitted.

Descriptions made above are merely specific embodiments of the invention, but the protection scope of the invention is not limited thereto. Any changes and replacements as can be easily conceived by those skilled in the art within the technical scope disclosed by the present invention, shall fall within the protection scope of the present invention. Therefore, the protection scope of the invention shall be defined by the protection scope of the claims.

This application claims the benefit of priority from Chinese patent application No. 201410226377.9, filed on May 27, 2014, the disclosure of which is incorporated herein in its entirety by reference as a part of the present application.

The invention claimed is:

1. A manufacturing method of an array substrate, comprising:

sequentially forming an active material layer, a gate insulating layer and a metal thin film on a base substrate, and patterning the active material layer, the gate insulating layer and the metal thin film by a first patterning process, so as to form a pattern including an active layer and a pattern including a gate electrode, a source electrode, a drain electrode, a gate line and a data line, with a part of the gate insulating layer being exposed at a periphery of the gate electrode, the gate line or the data line being disconnected at an intersection of the gate line and the data line;

forming a passivation layer on the base substrate, and patterning the passivation layer by a second patterning process, so as to form a source contact hole, by which a part of the source electrode and a part of the active layer are exposed, a drain contact hole, by which a part of the drain electrode and a part of the active layer are exposed, and a bridge-structure contact hole, by which a part of disconnected gate line or data line is exposed;

forming a transparent conductive thin film on the base substrate, and removing the transparent conductive thin film partially, so that a source contact section for electrically connecting the source electrode and the active layer is formed in the source contact hole, a drain contact section for electrically connecting the drain electrode and the active layer is formed in the drain contact hole, a pixel electrode electrically connected to the drain contact section is formed on the passivation layer above the drain electrode, and an bridge structure for electric connection of the disconnected gate line or data line is formed within the bridge-structure contact hole and over the passivation layer.

2. The manufacturing method of the array substrate according to claim 1, wherein, with a semi-transmissive mask, a first photoresist layer and a second photoresist layer are formed on the metal thin film, the first photoresist layer covers a region where the active layer is to be formed and a region where the gate line is to be formed, and includes a first portion covering the region where the active layer is to be formed and the region where the gate line is to be formed and a second portion around the first portion, the second photoresist layer covers a region where the source electrode is to be formed, a region where the drain electrode is to be formed and a region where the data line is to be formed, thicknesses of the first portion of the first photoresist layer and the second photoresist layer are each larger than thickness of the second portion of the first photoresist layer, and the first photoresist layer covering the region where the gate line is to be formed or the second photoresist layer covering the region where the data line is to be formed is disconnected at an intersection of the two;

with the first photoresist layer and the second photoresist layer as a mask, the exposed metal thin film and the gate insulating layer and the active material layer that are sheltered by the exposed metal thin film are removed, so as to form the pattern including the active layer and a pattern including the source electrode, the drain electrode, the gate line and the data line, the gate line or the data line being disconnected at the intersection of the gate line and the data line;

the second portion of the first photoresist layer is removed;

with the first portion of the first photoresist layer and the second photoresist layer as a mask, the metal thin film around the first portion of the first photoresist layer is removed, so that a pattern including the gate electrode is formed, and a part of the gate insulating layer is exposed at the periphery of the gate electrode.

3. The manufacturing method of the array substrate according to claim 1, after the pattern including the gate electrode is formed, further comprising:

doping the active layer around the gate electrode with the gate electrode as a mask; and conducting annealing on the base substrate, so as to activate the doped impurity.

4. The manufacturing method of the array substrate according to claim 1, wherein, a third photoresist layer and a fourth photoresist layer are formed on the passivation layer, the third photoresist layer covers the gate electrode, the source electrode, the gate line and the data line, the fourth photoresist layer covers the drain electrode, and thickness of the third photoresist layer is larger than thickness of the fourth photoresist layer;

with the third photoresist layer and the fourth photoresist layer as a mask, the exposed passivation layer is removed, so as to form a source contact hole, by which a part of the source electrode and a part of the active layer are exposed, a drain contact hole, by which a part of the drain electrode and a part of the active layer are exposed, and an bridge-structure contact hole, by which a part of the disconnected gate line or data line is exposed.

5. The manufacturing method of the array substrate according to claim 4, wherein, the fourth photoresist layer is removed;

a transparent conductive thin film is formed on the base substrate; and the third photoresist layer is stripped off, so as to remove the transparent conductive thin film covering the third photoresist layer, and form the source contact section, the drain contact section, the pixel electrode and the bridge structure.

6. The manufacturing method of the array substrate according to claim 1, wherein, forming the active material layer includes:

depositing an amorphous silicon material on the base substrate; and converting the amorphous silicon material into a polysilicon material by using a crystallizing process, so as to form the active material layer.

7. The manufacturing method of the array substrate according to claim 1, wherein, in the step of forming the pattern including the active layer, a pattern including a storage electrode is also formed at the same time, so as to form a storage capacitor jointly with the pixel electrode.

8. The manufacturing method of the array substrate according to claim 1, before the active material layer is formed, further comprising:

forming a buffer layer on the base substrate.

9. The manufacturing method of the array substrate according to claim 1, after the source contact section, the drain contact section and the pixel electrode are formed, further comprising:

forming a pixel defining layer on the base substrate.

10. An array substrate, comprising:

an active layer located on a base substrate;

a gate insulating layer covering the active layer;

a gate electrode, a source electrode, a drain electrode, a gate line and a data line located on the gate insulating layer and lying in the same film layer, wherein, a residual active material layer is formed between the source electrode and the base substrate, and between the drain electrode and the base substrate, respectively, the gate line or the data line is disconnected at a intersection of the gate line and the data line;

a passivation layer covering the gate electrode, the source electrode, the drain electrode, the gate line and the data line;

a source contact hole, a drain contact hole and bridge-structure contact hole that are located inside the passivation and the gate insulating layer, wherein, a part of the source electrode and a part of the active layer are exposed by the source contact hole, a part of the drain electrode and a part of the active layer are exposed by the drain contact hole, and a part of disconnected gate line or data line is exposed by the bridge-structure contact hole;

a source contact section, a drain contact section, a pixel electrode and an bridge structure that lie in the same film layer, wherein, the source contact section is located inside the source contact hole, and configured for electrically connecting the source electrode and the active layer; the drain contact section is located inside the drain contact hole, and configured for electrically connecting the drain electrode and the active layer; the pixel electrode is located on the passivation layer above the drain electrode, and is electrically connected to the drain electrode through the drain contact section; and the bridge structure is located within the bridge-structure contact hole and on the passivation layer, and configured for electrically connecting the disconnected gate line or data line.

11. The array substrate according to claim 10, wherein, material for the active layer is polycrystalline silicon.

12. The array substrate according to claim 10, wherein, material for the passivation layer is acryl.

13. The array substrate according to claim 10, wherein, thicknesses of the source contact section, the drain contact section, the pixel electrode and the bridge structure are in the range of 20 nm to 150 nm.

14. The array substrate according to claim 10, further comprising a storage electrode disposed in the same layer as the active layer, which forms a storage capacitor together with the pixel electrode.

15. The array substrate according to claim 10, further comprising a buffer layer located between the base substrate and the active layer.

16. The array substrate according to claim 10, further comprising a pixel defining layer that covers the source contact section, the drain contact section and the bridge structure.

17. The array substrate according to claim 16, wherein, material for the pixel defining layer is acryl.

18. A display device, comprising the array substrate according to claim 10.

19. The display device according to claim 18, wherein, the display device is a liquid crystal display device or an organic light emitting diode display device.

* * * * *